(12) United States Patent
van Arendonk

(10) Patent No.: US 8,669,633 B2
(45) Date of Patent: Mar. 11, 2014

(54) PACKAGED DEVICE WITH AN IMAGE SENSOR ALIGNED TO A FACEPLATE USING FIDUCIAL MARKS AND CONNECTION BODIES REGISTERED THERETO

(75) Inventor: Anton Petrus Maria van Arendonk, Waterloo (CA)

(73) Assignee: Teledyne Dalsa, Inc., Waterloo, Ontario (CA)

( * ) Notice: Subject to any disclaimer, the term of this patent is extended or adjusted under 35 U.S.C. 154(b) by 171 days.

(21) Appl. No.: 13/136,161

(22) Filed: Jul. 25, 2011

(65) Prior Publication Data
US 2012/0025341 A1 Feb. 2, 2012

Related U.S. Application Data

(60) Provisional application No. 61/400,454, filed on Jul. 28, 2010.

(51) Int. Cl.
*H01L 27/146* (2006.01)
*H01L 31/0203* (2006.01)

(52) U.S. Cl.
CPC ....... *H01L 31/0203* (2013.01); *H01L 27/14618* (2013.01)
USPC ............ 257/443; 257/E21.158; 257/E21.567; 257/E31.11

(58) Field of Classification Search
CPC .................................................. H01L 31/0203
USPC ............. 257/443, E21.158, E21.567, E31.11
See application file for complete search history.

(56) References Cited

U.S. PATENT DOCUMENTS

| | | | |
|---|---|---|---|
| 5,258,648 A | 11/1993 | Lin | |
| 5,739,585 A | 4/1998 | Akram et al. | |
| 6,229,158 B1 | 5/2001 | Minemier et al. | |
| 6,372,549 B2 | 4/2002 | Urushima | |
| 6,443,631 B1 | 9/2002 | Case et al. | |
| 6,526,205 B1 * | 2/2003 | Wilson et al. | 385/52 |
| 6,529,027 B1 | 3/2003 | Akram et al. | |
| 6,965,166 B2 | 11/2005 | Hikita et al. | |
| 7,065,283 B2 | 6/2006 | Steinberg et al. | |
| 7,233,723 B2 | 6/2007 | Williams et al. | |
| 7,253,388 B2 | 8/2007 | Kuhmann et al. | |
| 7,253,390 B2 | 8/2007 | Farnworth et al. | |
| 7,304,673 B2 * | 12/2007 | Erhardt et al. | 348/275 |
| 7,371,652 B2 | 5/2008 | Aizpuru et al. | |
| 7,547,571 B2 | 6/2009 | Cheng et al. | |
| 7,582,505 B2 | 9/2009 | Maeda et al. | |
| 7,619,312 B2 | 11/2009 | Krishnamoorthy et al. | |
| 7,632,713 B2 | 12/2009 | Farnworth et al. | |
| 7,646,075 B2 | 1/2010 | Akram | |
| 7,651,881 B2 | 1/2010 | Takasaki et al. | |
| 7,655,507 B2 | 2/2010 | Derderian et al. | |
| 7,709,915 B2 | 5/2010 | Morrison | |
| 2004/0189855 A1 * | 9/2004 | Takasaki et al. | 348/340 |
| 2005/0185900 A1 * | 8/2005 | Farr | 385/93 |
| 2005/0231626 A1 | 10/2005 | Tuttle et al. | |

* cited by examiner

*Primary Examiner* — Kimberly Rizkallah
*Assistant Examiner* — Alexander Belousov
(74) *Attorney, Agent, or Firm* — Eric A. Gifford

(57) ABSTRACT

An assembly includes a first packaged device that contains a first image sensor having first fiducial marks thereon. On a portion of the first packaged device at a predetermined location relative to the first fiducial marks is adhesive, and a first connection body is fixed within the adhesive and registered at the predetermined location relative to the first fiducial marks. The first connection body is mated into the first counter hole formed in a plate at a predetermined location.

11 Claims, 8 Drawing Sheets

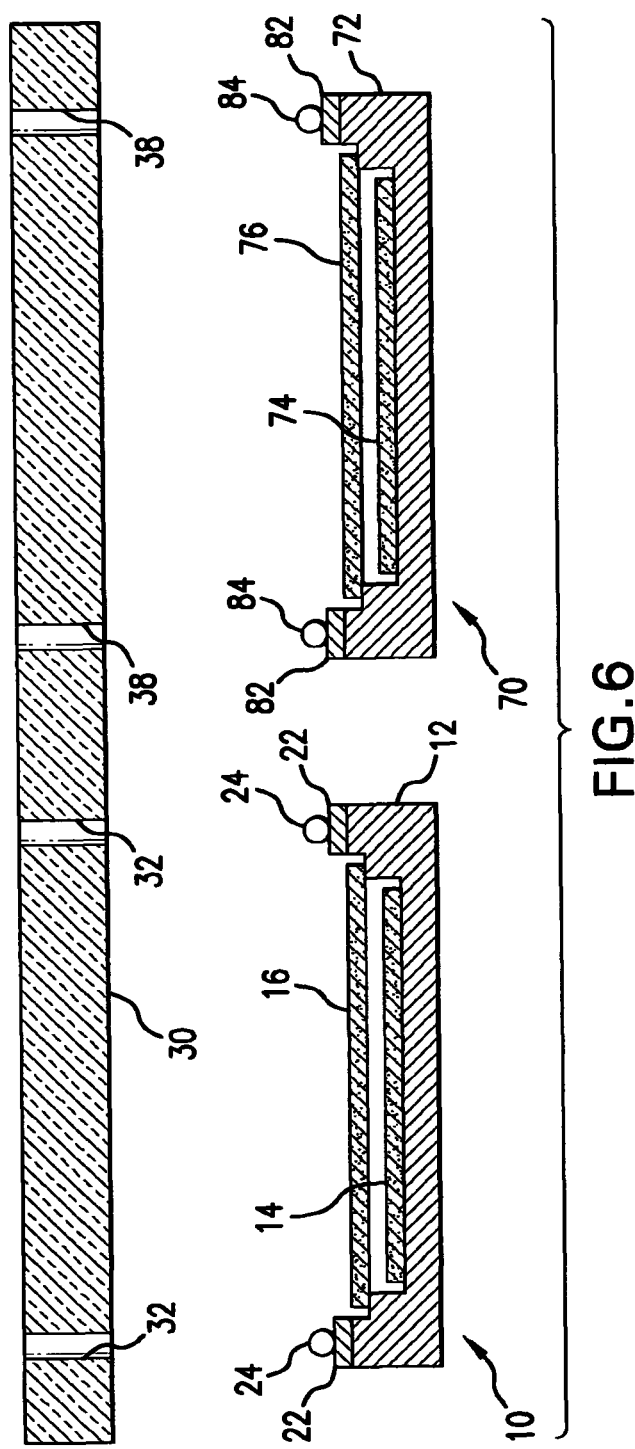

PACKAGED DEVICE WITH AN IMAGE SENSOR ALIGNED TO A FACEPLATE USING FIDUCIAL MARKS AND CONNECTION BODIES REGISTERED THERETO

The priority of the Jul. 28, 2010 filing date of provisional application No. 61/400,454 is hereby claimed.

BACKGROUND OF THE INVENTION

Description of Related Art

A semiconductor image sensor is formed by known processes in a semiconductor to create one or more dies that are commonly called "chips." During manufacturing, fiducial marks are formed in the chip that are precisely positioned relative to an optically active portion of the image sensor. The chip is mounted in a package, electrical connections are made between the chip and the package leads, and a package top is attached to form a complete packaged device. In the case of an image sensor, the package top is an optically transparent top, or at least transparent to the radiation wavelengths of the light to be imaged.

The packaged sensor is next aligned and assembled to the faceplate of a camera. Alignment ensures that any marks in or on the faceplate are aligned with respect to fiducial marks on the semiconductor chip. Known methods of alignment use what is called "active alignment" where the packaged image sensor is operated to image a test pattern through the faceplate. The position of the packaged device is then manipulated relative to the faceplate until the image produced by the image sensor is shown to be in alignment with the faceplate at which time the packaged device and the faceplate are fixed to one another. A less expensive method of alignment is desired.

SUMMARY OF THE INVENTION

In an example of the invention, a method includes applying uncured adhesive to a portion of a first packaged device, then placing a first connection body on the uncured adhesive at a predetermined location relative to first fiducial marks on a first image sensor contained within the first packaged device and then curing the uncured adhesive. A first counter hole has been formed in a plate at a predetermined location. The method further includes mating the first connection body into the first counter hole of the plate.

In another example of the invention, an assembly includes a first packaged device that contains a first image sensor having first fiducial marks thereon. On a portion of the first packaged device at a predetermined location relative to the first fiducial marks is adhesive, and a first connection body is fixed within the adhesive and registered at the predetermined location relative to the first fiducial marks. The first connection body is mated into the first counter hole formed in a plate at a predetermined location.

BRIEF DESCRIPTION OF DRAWINGS

The invention will be described in detail in the following description of preferred embodiments with reference to the following figures.

FIG. 6 is an exploded sectional view of an additional alternative embodiment.

DETAILED DESCRIPTION

In the alignment method described herein, precisely machined parts are assembled without use of "active alignment." The inventor had observed that tolerances in the locations of, for example, fiducial marks in image sensors are kept to exacting standards. However, the tolerances of the packages in which image sensors are mounted are considerably less exacting. When a faceplate needs to be mounted to an already packaged image sensor, it is customary to align the faceplate with the package However, tolerances in locations on the package are so much less exacting than tolerances in locations on image sensor that an aperture through the faceplate is not optimally aligned the active imaging area of the image sensor.

With the herein described technique, optical sensors do not require an accurate placement within a carrier and/or the package carrier does not have to be dimensioned very accurately, and therefore, the assembly of any device which requires an accurate alignment is made very easy and simple. The method herein improves the accuracy of alignment of the aperture through the faceplate with the image sensor.

Figure 1:
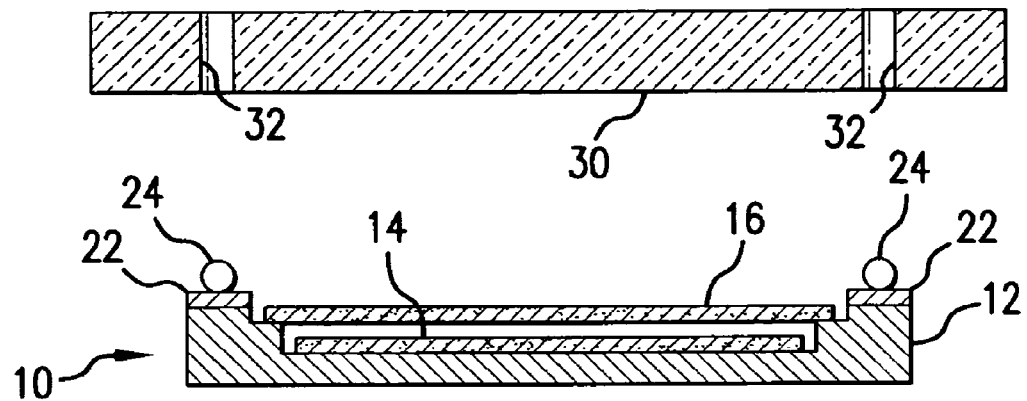
FIG. 1 is an exploded sectional view of packaged device 10, faceplate 30 and connection bodies 24 with adhesive 22.
Figure 2:
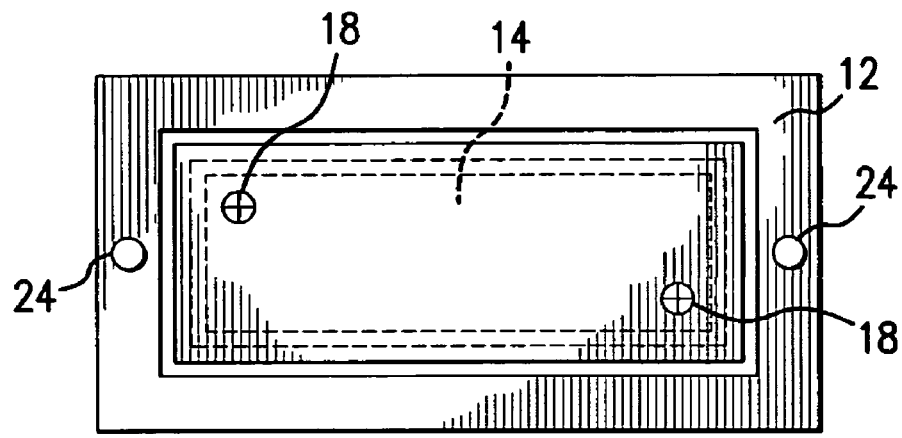
FIG. 2 is a plan view of packaged device 10 on which connection bodies 24 have been fixed at positions relative to fiducial marks 18.

In FIGS. 1 and 2, packaged device 10 is assembled in which image sensor 14 is mounted in carrier 12. Electrical connections are made between the chip and package leads (not shown for clarity), and package top 16 is attached to form a completed packaged device 10.

An uncured adhesive material 22 is applied to an optically inactive portion of packaged device 10. Connection bodies 24 (for example, small spheres or microspheres) of any suitable material (e.g., sapphire) are carefully placed on the uncured adhesive at precise predetermined locations relative to the fiducial marks 18 (FIG. 2) that had been formed in image sensor 14. Adhesive material 22 is then cured. Preferably, the adhesive is cured using UV light to accelerate curing until connection bodies 24 are fixed to packaged device 10 at precise predetermined locations relative to fiducial marks 18 that had been formed in image sensor 14.

A faceplate 30 is prepared with one or more holes 32 formed therein of the same diameter as connection bodies 24 at precise predetermined locations relative to the faceplate. In particular, holes 32 are formed in faceplate 30 at locations precisely defined relative to a precision aperture through the faceplate or relative to marks in or on a faceplate. For example, the faceplate is made of metal (e.g., aluminum) with an open aperture therein to limit reflections.

The dimensions of the aperture are precisely matched to the dimensions of the optically active portion of image sensor 14, and the locations of holes 32 are precisely located with respect to the aperture. Connection bodies 24 are accurately located on carrier 12 with respect to fiducial marks 18 in image sensor 14. Packaged device 10 is then positioned on face plate 30, or faceplate 30 is position on packaged device 10, using connection bodies 24 to accurately align faceplate 30 with fiducial marks 18 so that the optically active portion of the image sensor (the chip) is aligned with the aperture through the faceplate.

In another version of the alignment system, a first, highly accurate manufactured part (such as a semiconductor die with fiducial marks) is enclosed within a second, less accurately manufactured part (such as a carrier). Then, it is desired to mount the second, less accurately manufactured part (e.g., the carrier) relative to a third, accurately manufactured part (e.g., a faceplate) such that the first, highly accurate manufactured part (e.g., the semiconductor die with fiducial marks) is accurately positioned relative to the third part. This is accomplished by creating accurately positioned intermediate registration points (e.g., connection bodies) that are positioned on the second, less accurately manufactured part (e.g., the carrier) relative to the first, highly accurate manufactured part (such as a semiconductor die with fiducial marks) positions accurately registered to fiducial marks on the first, highly accurate manufactured part (such as a semiconductor die with fiducial marks).

In a variant, a method includes applying uncured adhesive material 22 to two optically inactive portions of packaged device 10. Two connection bodies 24 (for example, small spheres or microspheres) of any suitable material (e.g., sapphire) are carefully placed on the uncured adhesive at precise predetermined locations relative to the fiducial marks 18 (FIG. 2) that had been formed in image sensor 14. Adhesive material 22 is then cured, preferably using UV light to accelerate curing, until connection bodies 24 are fixed to packaged device 10 at precise predetermined locations relative to fiducial marks 18 that had been formed in image sensor 14. The two connection bodies 24 fix a predetermined rotation angle of a line extending between the two connection bodies and the first fiducial marks 18. Faceplate 30 is prepared with two holes 32 formed therein of the same diameter as connection bodies 24 at precise predetermined locations relative to the faceplate. In particular, two holes 32 are formed in faceplate 30 at locations precisely defined relative to a precision aperture through the faceplate or relative to marks in or on a faceplate. For example, a faceplate may be made of aluminum with an open aperture therein. Then, connection bodies 24 are mated into the two hole 32 in the plate so that a predetermined rotation angle is fixed between the faceplate and the line extending between the two connection bodies 24.

Generally in FIGS. 1 and 2, a method of assembling second and third parts where a first part (14) has been packaged within the second part (10) includes applying uncured adhesive (22) to the second part and placing a connection body (24) on the uncured adhesive at a location registered relative to fiducial marks (18) on the first part (14). The method further includes curing the adhesive. In a third part (30) in which has been formed a counter hole (32) at a predetermined location, the method includes mating the connection body (24) into the counter hole (32) of the third part (30).

For example, the method includes applying uncured adhesive (22) to a portion of a first packaged device (10) and placing a first connection body (24) on the uncured adhesive (22) at a predetermined location relative to first fiducial marks (18) on a first image sensor (14) contained within the first packaged device (10). The method also includes curing the uncured adhesive. In a plate (30) in which has been formed a first counter hole (32) at a predetermined location, the method includes mating the first connection body (24) into the first counter hole (32) of the plate (30).

The assembly made includes a first packaged device (10) that contains a first image sensor (14) having first fiducial marks (18) thereon. The assembly further includes adhesive (22) on a portion of the first packaged device (10) at a predetermined location relative to first fiducial marks (18) and a first connection body (24) is fixed within the adhesive (22) and registered at the predetermined location relative to the first fiducial marks. The assembly further includes a plate (30) in which has been formed a first counter hole (32) at a predetermined location, wherein the first connection body (24) is mated into the first counter hole (32) in the plate (30).

Conveniently, 2 millimeter sapphire spheres with a diameter tolerance of +/−2 microns are currently commercially available. However, spheres are not the only mechanical shape that may be used as connection bodies 24 for this alignment connection function. Any shape, such as a post or rod, can be used for this alignment connection function as along as the shape can be handled and a precise counter hole can be formed in the faceplate.

Spheres or other shapes may be manually placed on uncured adhesive 22 using a fixture aligned with the fiducial marks of image sensor 14. However, such spheres or other shapes are preferably placed on uncured adhesive 22 using a "pick and place" system such as is currently in use in similar assembly operations. An example of such a pick and place system is made by Datacon™. Jig 40 is described herein with respect to FIG. 5.

Figure 3:
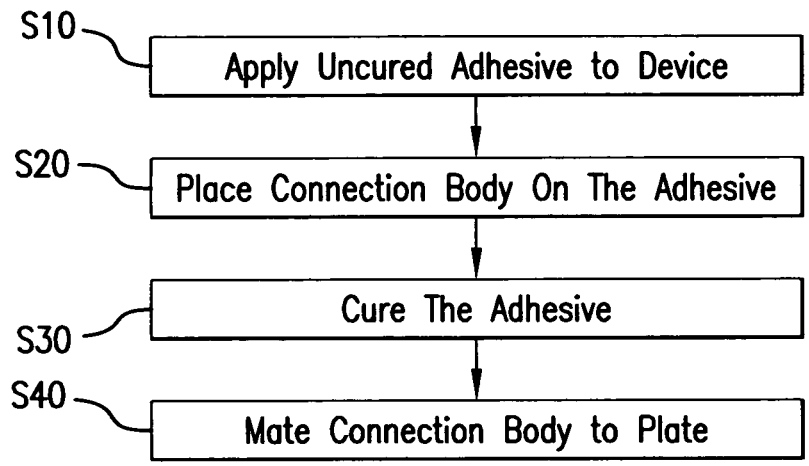
FIG. 3 is a flow chart of the method of aligning

FIG. 3 depicts an exemplary method of aligning an image sensor within a packaged device with a plate. At step S10, uncured adhesive is applied to an optically inactive portion of the packaged device. At step S20, a connection body is placed on the uncured adhesive at a precise predetermined location relative to fiducial marks on the image sensor within the packaged device. At step S30, the adhesive is cured. At step S40, the connection body is mated to a plate in which has been formed a counter hole at a precise predetermined location.

Figure 4:
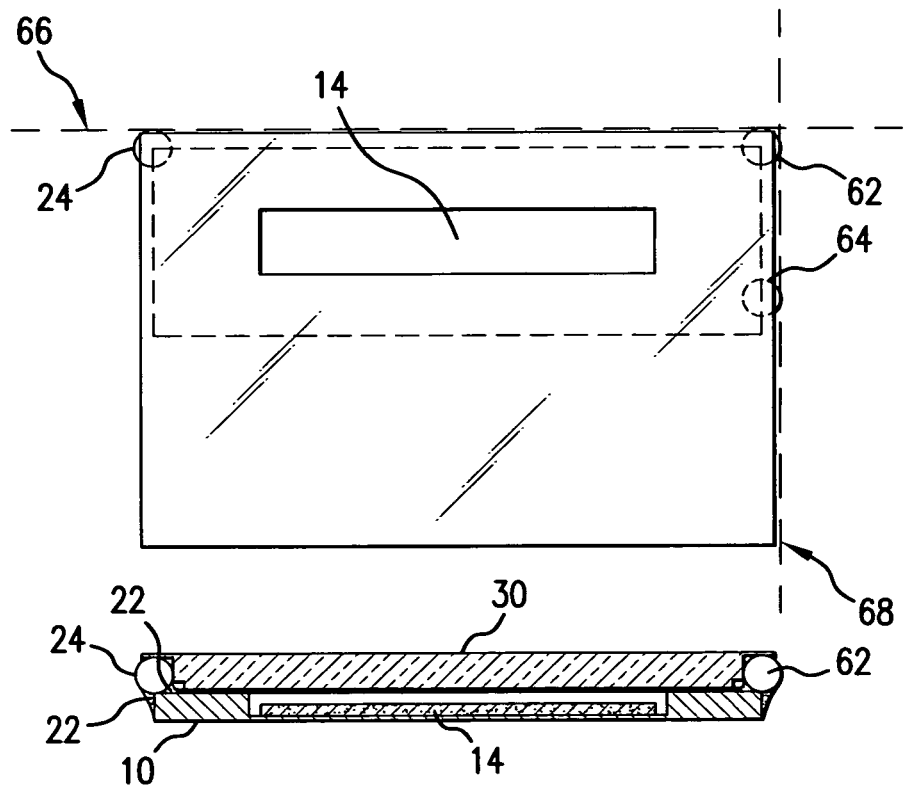
FIG. 4 is a plan view of an alternative embodiment.

In FIG. 4, an alignment system using three connection bodies is depicted. Three connection bodies define a plane within a three-dimensional space. The faceplate is therefore exactly located with respect to the three connection bodies. When connection bodies 24 are located precisely with respect to fiducial marks 18, it is possible to precisely locate an aperture within faceplate 30 (using holes 32) with respect to fiducial marks 18 of image sensor 14.

As depicted in FIGS. 1, 2 and 4, an exemplary method includes applying uncured adhesive (22) to a portion of a first packaged device (10) and placing a first connection body (24) on the uncured adhesive (22) at a predetermined location relative to first fiducial marks (18) on a first image sensor (14) contained within the first packaged device (10). In addition as depicted in FIG. 4, the method further includes applying further adhesive to plural portions of the first packaged device and placing a second connection body (62) and a third connection body (64) on the further adhesive at respective second and third predetermined locations relative to the first fiducial marks on the first image sensor contained within the first packaged device, the first, second and third connection bodies define a plane. The method also includes curing the uncured adhesive and the further adhesive. In a plate (30) in which has been formed a first counter hole (32), as well as a second counter hole and a third counter hole at a predetermined locations, the method includes mating the first connection body (24) into the first counter hole (32) of the plate (30), mating the second connection body into the second counter hole and mating the third connection body into the third counter hole of the plate.

As depicted in FIGS. 1, 2 and 4, an assembly made by this method includes a first packaged device (10) that contains a first image sensor (14) having first fiducial marks (18). The assembly also includes adhesive (22) on a portion of the first packaged device at a predetermined location relative to first fiducial marks as well as additional adhesive on plural additional portions of the first packaged device at respective second and third predetermined locations relative to the first fiducial marks, and a first connection body (24) fixed within the adhesive and registered at the predetermined location relative to the first fiducial marks as well as a second connection body (62) and a third connection body (64) fixed within the additional adhesive and registered at respective second and third predetermined locations relative to the first fiducial marks. The first, second and third connection bodies define a plane. The assembly also includes a plate (30) in which has been formed a first counter hole (32) at a predetermined location as well as a second counter hole and a third counter hole at respective predetermined locations. The first connection body (24) is mated into the first counter hole (32), the second connection body is mated into the second counter hole and the third connection body is mated into the third counter hole in the plate in the plate. In this way the tilt of the plane, that is the plate, can be controlled.

In another example, the spheres or other connection bodies intentionally extend beyond the perimeter of the carrier. In FIG. 4, alignment plane 66 is defined by connection bodies 24 and 62, and alignment plane 68 is defined by connection bodies 62 and 64. A location is therefore accurately defined with respect to fiducial marks on the silicon in two planes abutting adjacent to the packaged device. This additional functionality can be used, for example, to align an adjacent additional and abutting camera or other device. The function of aligning adjacent devices permits the alignment of multiple cameras in a very accurate manner just by using these two planes. Multiple cameras can be aligned in a staggered, line or radial pattern to achieve a mechanical high precision x, y, theta alignment on larger format multiple sensor cameras. For example in FIG. 10, package device 162 (e.g., as containing a sensor chip) abuts adjacent package device 164 (e.g., as containing another sensor chip) at alignment plane 166 to accurately align sensors within respective package devices 162 and 164. This provides great benefits. For example, software "stitching" together of images can be made easier where the images were produced from image sensors that were more accurately aligned with respect to one another. Usually lose of no more than 1 or 2 columns is tolerable when stitching. The better the "mechanical" alignment which is becoming more important when in large devices, the better will be the software stitching in the final result.

As depicted in FIGS. 1, 2 and 4, an exemplary method includes applying uncured adhesive (22) to a portion of a first packaged device (10) and placing a first connection body (24) on the uncured adhesive (22) at a predetermined location relative to first fiducial marks (18) on a first image sensor (14) contained within the first packaged device (10). In addition as depicted in FIG. 4, the method further includes applying additional adhesive to another portion of the first packaged device (10) and placing a second connection body (62) on the additional adhesive at a second predetermined location relative to the first fiducial marks (18) on the first image sensor (14) contained within the first packaged device (10). The first and second connection bodies (24, 62) define an abutting line (66). A second counter hole has been formed in the plate at a predetermined location. The method also includes curing the uncured adhesive and the additional adhesive, mating the first connection body (24) into the first counter hole (32) and mating the second connection body (62) into the second counter hole in plate 30. The plate (30) and the first packaged device (10) form a sandwich structure around the first connection body (24) and the second connection body (62). The first and second connection bodies define an abutting line (66) disposed beyond an edge of the sandwich structure. The method further includes fixing the first packaged device (10) and a second packaged device (e.g., 70) to a common substrate (not shown for clarity) while the second packaged device is urged laterally against the first and second connection bodies (24, 62) at the abutting line (66).

As depicted in FIGS. 1, 2 and 4, an assembly made by this method includes a first packaged device (10) that contains a first image sensor (14) having first fiducial marks (18). The assembly also includes adhesive (22) on a portion of the first packaged device at a predetermined location relative to first fiducial marks as well as additional adhesive on another portion of the first packaged device. A first connection body (24) is fixed within the adhesive and registered at the predetermined location relative to the first fiducial marks as well as a second connection body (62) fixed within the additional adhesive at a second predetermined location relative to the first fiducial marks on the first image sensor contained within the first packaged device. The assembly also includes a plate (30) in which has been formed a first counter hole (32) at a predetermined location as well as a second counter hole formed in the plate (30) at a predetermined location. The second connection body (62) is mated into the second counter hole. The plate (30) and the first packaged device (10) form a sandwich structure around the first and second connection bodies (24, 62). The first and second connection bodies define an abutting line (66) disposed beyond an edge of the sandwich structure. The assembly also includes a common substrate on which is fixed the first packaged device and a second packaged device (70) urged laterally against the first and second connection bodies to be aligned at the abutting line with the first packaged device (10). The second packaged device is fixed to the common substrate while urged against the first and second connection bodies. This enables two packaged devices, for example containing image sensors, to be very accurately aligned. This provides great benefits. For example, "stitching" images together can be made easier where the images were produced from image sensors that were accurately aligned with respect to one another.

Furthermore, extending this technique to align additional packaged devises on a transverse direction enables a tiled array of image sensors in two dimensions to be accurately aligned. In FIG. 4, a first abutting line 66 in a first dimension is defined by first and second connection bodies 24 and 62. In FIG. 4, a second abutting line 68 in a second dimension is defined by second and third connection bodies 62 and 64. The first abutting line 66 is oriented transverse, preferably perpendicular, to the second abutting line 68. By extension, a two-dimensional array of any practical dimension can be formed.

Figure 5:
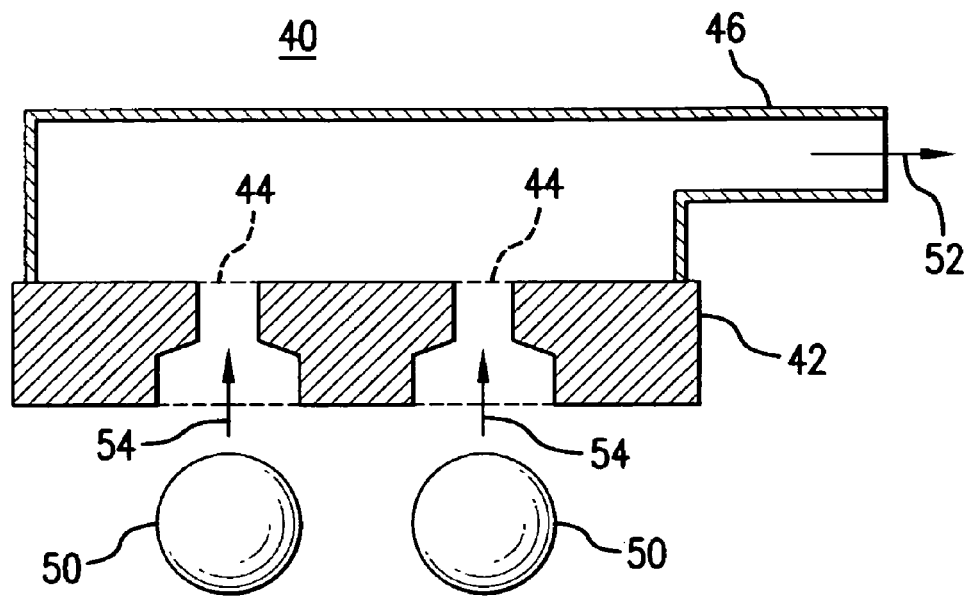
FIG. 5 is a schematic diagram of a jig for assembly of spheres using a manual technique instead of using a pick and place system.

In FIG. 5, jig 40 includes hood 46 and calibrated plate 42 in which has been formed compound holes 44. Compound holes 44 penetrate through calibrated plate 42, but have a diameter to match connection bodies 50 at a depth partially through plate 42 from a first side and a smaller diameter at a depth partially through plate 42 from a second side. In operation, a vacuum source is connected to withdraw air at 52 from hood 46 causing a partial vacuum to draw air 54 through holes 44 and lift connection bodies 50 into the larger diameter of holes 44. Although jig 40 is depicted schematically, practical versions of jig 40 are configured to provide an operator with an aperture through to view the fiducial marks 18 on image sensor 14 (see FIGS. 1 and 2) so that connection bodies 50 can be placed in adhesive material 22 at locations accurately registered to fiducial marks 18 before the vacuum is turned off and the connection bodies are permanently fixed in adhesive material 22.

In another example of the alignment system depicted in FIG. 6, a stereoscopic camera system is formed. Two spaced apart apertures and corresponding registration holes are formed within a dual aperture faceplate. Connection bodies 24 are fixed on a first packaged device 10 at locations accurately registered with respect to fiducial marks 18 of the image sensor within first packaged device 10. Also, connection bodies 24 are fixed on a second packaged device at locations accurately registered with respect to fiducial marks of the image sensor within the second packaged device. Then, first packaged device 10 is aligned to a first aperture using respective holes within the dual aperture faceplate and the second packaged device is aligned to a second aperture using respective holes within the dual aperture faceplate. This concept can be advantageously extended to multiple packaged devices such as packaged device 10.

Generally in FIG. 6, a method includes applying uncured adhesive (22) to a portion of a first packaged device (10) and placing a first connection body (24) on the uncured adhesive (22) at a predetermined location relative to first fiducial marks (18) on a first image sensor (14) contained within the first packaged device (10). The method also includes curing the uncured adhesive. In a plate (30) in which has been formed a first counter hole (32) at a predetermined location, the method includes mating the first connection body (24) into the first counter hole (32) of the plate (30). The method also includes applying further adhesive (82) to a portion of a second packaged device (70), placing a second connection body (84) on the further adhesive (82) at a predetermined location relative to second fiducial marks on a second image sensor contained within the second packaged device, and curing the further adhesive. The method further includes, in the plate (30) in which has been formed a second counter hole (38) at a second predetermined location, mating the second connection body (84) into the second counter hole (38) of the plate (30).

The assembly made includes a first packaged device (10) that contains a first image sensor (14) having first fiducial marks (18) thereon. The assembly further includes adhesive (22) on a portion of the first packaged device (10) at a predetermined location relative to first fiducial marks (18) and a first connection body (24) is fixed within the adhesive (22) and registered at the predetermined location relative to the first fiducial marks. The assembly further includes a plate (30) in which has been formed a first counter hole (32) at a predetermined location and a second counter hole (38) located at another predetermined location. The first connection body (24) is mated into the first counter hole (32) in the plate (30). The assembly also includes a second packaged device (70) that contains a second image sensor having second fiducial marks thereon, adhesive (82) on a portion of the second packaged device (70) at a predetermined location relative to second fiducial marks, and a second connection body (84) fixed within the adhesive (82) and registered at the predetermined location relative to second fiducial marks. The second connection body (84) is mated into the second counter hole (38) in the plate (30).

Figure 7:
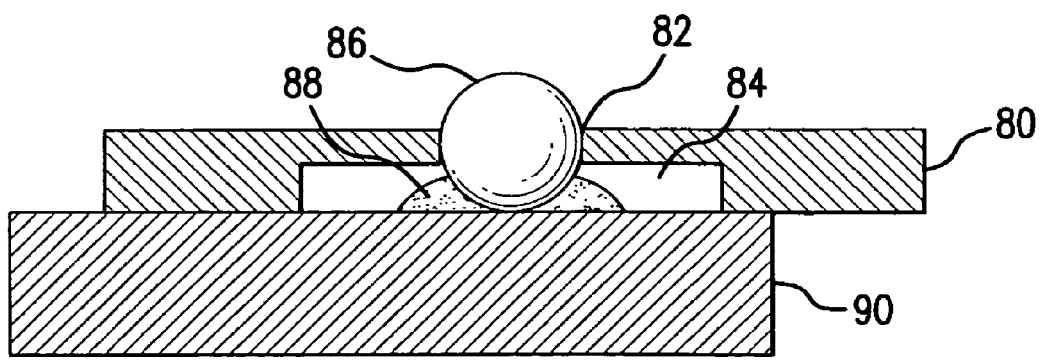
FIG. 7 is a section view of another alternative embodiment.

In another embodiment depicted in FIG. 7, the connection body (e.g., a sphere) is fixed in a small quantity of adhesive material on the top side of the packaged device. The faceplate is thinner than the diameter of the connection body (i.e., sphere). A hole is formed through the faceplate. The hole is the diameter of the sphere, and an enlarged pocket is formed on the lower portion of the faceplate to accommodate space for the quantity of adhesive. Since the sphere has a diameter greater than the thickness of the faceplate, the sphere extends above the top surface of the faceplate. The top of the sphere is available for alignment of another layer of some material (e.g., glass, etc.) that has corresponding holes formed therein.

Generally, in FIGS. 1, 2 and 7, an exemplary method includes applying uncured adhesive (22) to a portion of a first packaged device (10) and placing a first connection body in the shape of a sphere (86) on the uncured adhesive (22) at a predetermined location relative to first fiducial marks (18) on a first image sensor (14) contained within the first packaged device (10). The method also includes curing the uncured adhesive. In FIG. 7, a plate (80) has formed therein at a predetermined location a first counter hole consisting of a first portion (82) and a second portion (84), and the plate 80 is thinner than a diameter of the sphere. First portion 82 comprises a through hole characterized by a diameter substantially equal to the diameter of the sphere although the diameter may be slightly larger than the diameter of the sphere so that the sphere can be inserted into the first portion (82). Second portion 84 is co-axial with first portion 82. Second portion 84 comprises a non-through hole partially penetrating the plate from a first surface and characterized by a diameter substantially larger than the diameter of the sphere in order to accommodate adhesive 88 that fixes sphere 86 to the top side of package 90. Second portion 84 provides sufficient volume to accommodate the bulk of adhesive 88. The method includes mating the first connection body (86) into the first counter hole (82, 84) of the plate (80) where the mating of the first connection body into the plate comprises configuring the first packaged device to face the first surface of the plate. As depicted in FIG. 7, a portion of the sphere (preferably almost half) protrudes through the first counter hole (82, 84) to rise above plate 80 and provide a reference point for aligning other bodies, devices or plates.

This method (e.g., FIG. 7) controls of the Z-height of another level (e.g., a lens) by using a predetermined desired diameter sphere 86. The image sensor 14 or other die is attached within carrier 12 with height very accurately controlled with respect to the top surface of the portion of carrier 12 that will become packaged device 10 when assembled (see FIGS. 1, 2). In this way, the sphere is used to accurately control the Z-height from the surface of sensor 14 to a lens or faceplate by selecting a proper sphere diameter.

Generally, in FIGS. 1, 2 and 7, an assembly made by this exemplary method includes a first packaged device (10) that contains a first image sensor (14) having first fiducial marks (18). The assembly includes an adhesive (22 in FIG. 1, 88 in FIG. 7) on a portion (90 in FIG. 7) of the first packaged device (10) at a predetermined location relative to the first fiducial marks and a first connection body (24 in FIG. 1, 86 in FIG. 7) fixed within the adhesive (88 in FIG. 7) and registered at the predetermined location relative to the first fiducial marks. The assembly also includes a plate (80 in FIG. 7) in which has been formed a first counter hole consisting of first portion 82 (FIG. 7) and second portion 84 (FIG. 7) at a predetermined location. The first connection body is mated into the first counter hole in the plate.

In FIG. 7, the first connection body is a sphere (86), the plate (80) is thinner than a diameter of the sphere, and the first counter hole in the plate includes a first portion 82 and a second portion 84. First portion 82 comprises a through hole characterized by a diameter substantially equal to the diameter of the sphere although the diameter may be slightly larger than the diameter of the sphere so that the sphere can be inserted into the first portion (82). Second portion 84 is co-axial with the first portion 28. Second portion 84 comprises a non-through hole partially penetrating the plate from a first surface and characterized by a diameter substantially larger than the diameter of the sphere in order to accommodate adhesive 88 that fixes sphere 86 to the top side of package 90. Second portion 84 provides sufficient volume to accommodate the bulk of adhesive 88. The first connection body is mated into the first counter hole in the plate. As depicted in FIG. 7, a portion of the sphere (preferably almost half) protrudes through the first counter hole (82, 84) to rise above plate 80 and provide a reference point for aligning other bodies, devices or plates.

Figure 8:
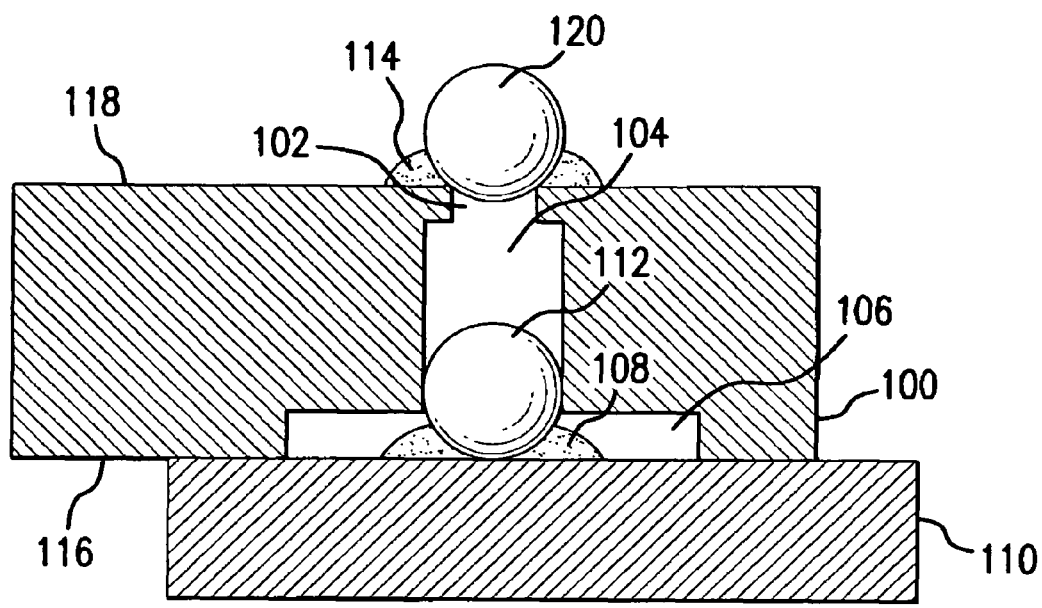
FIG. 8 is a section view of yet another alternative embodiment.

In another embodiment depicted in FIG. 8, the connection body (e.g., a sphere) is fixed in a small quantity of adhesive material on the top side of the packaged device as in FIG. 7. However, in FIG. 8, the faceplate is thicker than the diameter of the connection body (i.e., sphere). A hole is formed partially through the faceplate where the hole has a diameter equal to the diameter of the sphere, and an enlarged pocket is formed on a lower portion of the faceplate to accommodate space for the quantity of adhesive. Since the faceplate is thicker than the diameter of the sphere, the sphere cannot extend above the top surface of the faceplate. In FIG. 8, a small hole is formed through the faceplate and the hole has a diameter smaller than the diameter of the sphere. A second sphere is positioned over the small hole in the faceplate and fixed to the top of the faceplate with adhesive material. The second sphere is available for alignment of another layer of some material (e.g., glass, etc.) that has corresponding holes formed therein.

Generally, in FIGS. 1, 2 and 8, an exemplary method includes applying uncured adhesive (22) to a portion of a first packaged device (10) and placing a first connection body (24) in the shape of a sphere (112 in FIG. 8) on the uncured adhesive (22) at a predetermined location relative to first fiducial marks (18) on a first image sensor (14) contained within the first packaged device (10). The method also includes curing the uncured adhesive. In FIG. 8, a plate (100) has formed therein at a predetermined location a first counter hole consisting of a first portion (102), a second portion (104) and a third portion (106), and the plate 100 is thicker than a diameter of the sphere. First portion 102 comprises a through hole characterized by a diameter substantially smaller than the diameter of the sphere. Second portion 104 is co-axial with the first portion and comprising a non-through hole partially penetrating the plate from a first surface (116) to a depth greater than the diameter of the sphere and characterized by a diameter substantially equal to the diameter of the sphere although the diameter may be slightly larger than the diameter of the sphere so that the sphere can be inserted into the first portion (104). Third portion 106 is co-axial with the first portion and comprising another non-through hole partially penetrating the plate from the first surface (116) and characterized by a diameter substantially larger than the diameter of the sphere in order to accommodate adhesive 108 that fixes sphere 112 to the top side of package 110. Third portion 106 provides sufficient volume to accommodate the bulk of adhesive 108. The method includes mating the first connection body (112) into the first counter hole (102, 104, 106) of the plate (100) where the mating of the first connection body into the plate comprises configuring the first packaged device to face the first surface of the plate.

The method further comprises applying uncured adhesive to a second surface (118) of the plate in a substantially concentric ring around first portion 102 of the first counter hole, then placing another sphere (120) on the uncured adhesive at a location centered on the first portion of the first counter hole, and curing the uncured adhesive.

Generally, an assembly made by this exemplary method includes a first packaged device (10) that contains a first image sensor (14) having first fiducial marks (18). The assembly includes an adhesive (22 in FIG. 1, 108 in FIG. 8) on a portion (110 in FIG. 8) of the first packaged device (10) at a predetermined location relative to the first fiducial marks and a first connection body (24 in FIG. 1, 112 in FIG. 8) fixed within the adhesive (108 in FIG. 8) and registered at the predetermined location relative to the first fiducial marks. The assembly also includes a plate (100 in FIG. 8) in which has been formed a first counter hole consisting of first portion 102 (FIG. 8), second portion 104 (FIG. 8) and third portion 106 (FIG. 8) at a predetermined location. The first connection body is mated into the first counter hole in the plate.

In FIG. 8, first portion 102 comprises a through hole characterized by a diameter substantially smaller than the diameter of the sphere. Second portion 104 is co-axial with the first portion and comprising a non-through hole partially penetrating the plate from a first surface (116) to a depth greater than the diameter of the sphere and characterized by a diameter substantially equal to the diameter of the sphere although the diameter may be slightly larger than the diameter of the sphere so that the sphere can be inserted into the first portion (104). Third portion 106 is co-axial with the first portion and comprising another non-through hole partially penetrating the plate from the first surface (116) and characterized by a diameter substantially larger than the diameter of the sphere in order to accommodate adhesive 108 that fixes sphere 112 to the top side of package 110. Third portion 106 provides sufficient volume to accommodate the bulk of adhesive 112.

The assembly further comprises additional adhesive (114) on a second surface (118) of the plate (100) in a substantially concentric ring around first portion 102 of the first counter hole, and another sphere 120 fixed within additional adhesive 114 at a location centered on first portion 102 of the first counter hole.

Figure 9:
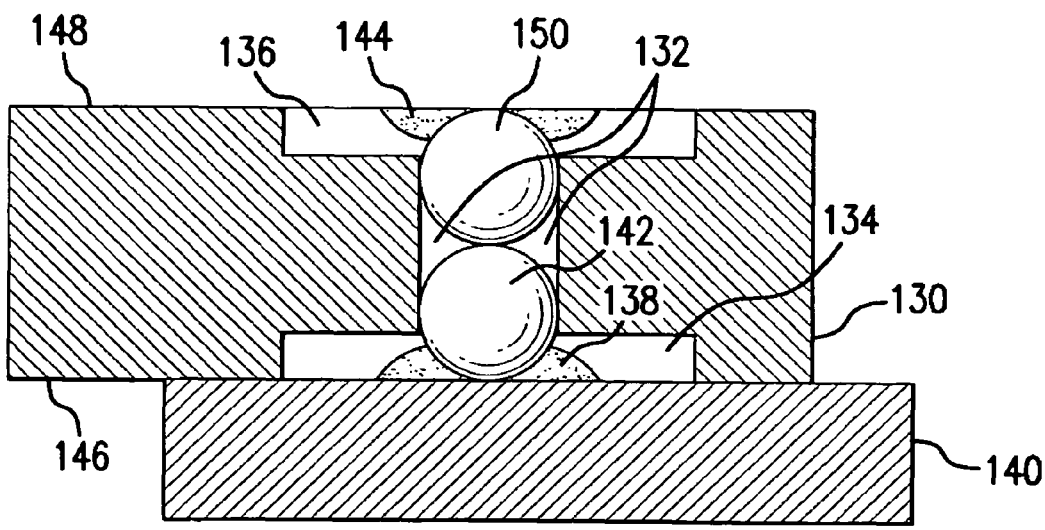
FIG. 9 is a section view of still another alternative embodiment using a flip technique and a double alignment process to align two individual parts each provided with connection bodies with respect to a faceplate.

In yet another embodiment depicted in FIG. 9, the connection body (e.g., a sphere) is fixed in a small quantity of adhesive material on the top side of the packaged device. Here, the faceplate is thicker than the diameter of the connection body (i.e., sphere). A hole of the same diameter as the sphere is formed through the faceplate. An enlarged pocket is formed this time on both lower and upper portions of the faceplate to accommodate space for the quantity of adhesive. Since the sphere has a diameter less than the thickness of the faceplate, the hole and associated pocket on the top surface of the faceplate is available for alignment of another layer of some material (e.g., glass, etc.) that has corresponding holes formed therein.

Generally, in FIGS. 1, 2 and 9, an exemplary method includes applying uncured adhesive (22) to a portion of a first packaged device (10) and placing a first connection body (24) in the shape of a sphere (142) on the uncured adhesive (22) at a predetermined location relative to first fiducial marks (18) on a first image sensor (14) contained within the first packaged device (10). The method also includes curing the uncured adhesive.

In FIG. 9, a plate (130) has formed therein at a predetermined location a first counter hole consisting of a first portion (132), a second portion (134) and a third portion (136), and the plate 130 is thicker than two times a diameter of the sphere. First portion 132 comprises a through hole characterized by a diameter substantially equal to the diameter of the sphere although the diameter may be slightly larger than the diameter of the sphere so that the sphere can be inserted into the first portion (104). Second portion 134 is co-axial with the first portion and comprises a non-through hole partially penetrating the plate from a first surface 146 and characterized by a diameter substantially larger than the diameter of the sphere in order to accommodate adhesive 138 that fixes sphere 142 to the top side of package 140. Second portion 134 provides sufficient volume to accommodate the bulk of adhesive 138. Third portion 136 is co-axial with the first portion and comprises another non-through hole partially penetrating the plate from a second surface 148 and characterized by a diameter substantially larger than the diameter of the sphere in order to accommodate adhesive 144 that fixes sphere 150 to another device mounted and aligned above (as depicted in FIG. 9) plate 130. Third portion 136 provides sufficient volume to accommodate the bulk of adhesive 144. The method includes mating the first connection body (142) into the first counter hole (132, 134, 136) of the plate (130) where the mating of the first connection body into the plate comprises configuring the first packaged device to face the first surface of the plate.

The exemplary method depicted in FIG. 9 further includes applying uncured adhesive 144 to a first surface of a body 152 at a predetermined location referenced to a location of an axis of the first counter hole and placing a second sphere 150 on the uncured adhesive 144 at the predetermined location referenced to the location of the axis of the first counter hole. Then, the method includes curing the uncured adhesive 144 and mating the second sphere 150 into the first counter hole (first portion 132) of the plate 130 while arranging the second surface 148 of the plate 130 to face the first surface of the body.

An assembly made by this exemplary method includes a first packaged device (10) that contains a first image sensor (14) having first fiducial marks (18). The assembly includes an adhesive (22 in FIG. 1, 138 in FIG. 9) on a portion (140 in FIG. 9) of the first packaged device (10) at a predetermined location relative to the first fiducial marks and a first connection body (24 in FIG. 1, 142 in FIG. 9) fixed within the adhesive (138 in FIG. 9) and registered at the predetermined location relative to the first fiducial marks. The assembly also includes a plate (130 in FIG. 9) in which has been formed a first counter hole consisting of first portion 132 (FIG. 9), second portion 134 (FIG. 9) and third portion 136 (FIG. 9) at a predetermined location. The first connection body is mated into the first counter hole in the plate.

First portion 132 comprises a through hole characterized by a diameter substantially equal to the diameter of the sphere although the diameter may be slightly larger than the diameter of the sphere so that the sphere can be inserted into the first portion (104). Second portion 134 is co-axial with the first portion and comprises a non-through hole partially penetrating the plate from a first surface 146 and characterized by a diameter substantially larger than the diameter of the sphere in order to accommodate adhesive 138 that fixes sphere 142 to the top side of package 140. Second portion 134 provides sufficient volume to accommodate the bulk of adhesive 142. Third portion 136 is co-axial with the first portion and comprises another non-through hole partially penetrating the plate from a second surface 148 and characterized by a diameter substantially larger than the diameter of the sphere in order to accommodate adhesive 144 that fixes sphere 150 to another device mounted and aligned above (as depicted in FIG. 9) plate 130. Third portion 136 provides sufficient volume to accommodate the bulk of adhesive 144. The first connection body (142) is mated into the first counter hole (132, 134, 136) of the plate (130), and the first packaged device faces the first surface 146 of the plate 130.

The assembly depicted in FIG. 9 further includes adhesive 144 on a first surface of a body 152 at a predetermined location referenced to a location of an axis of the first counter hole and a second sphere 150 fixed to the adhesive 144 at the predetermined location referenced to the location of the axis of the first counter hole. The second sphere 150 is mated into the first counter hole (first portion 132) of the plate 130. The second surface 148 of the plate 130 faces the first surface of the body 152.

Figure 10:
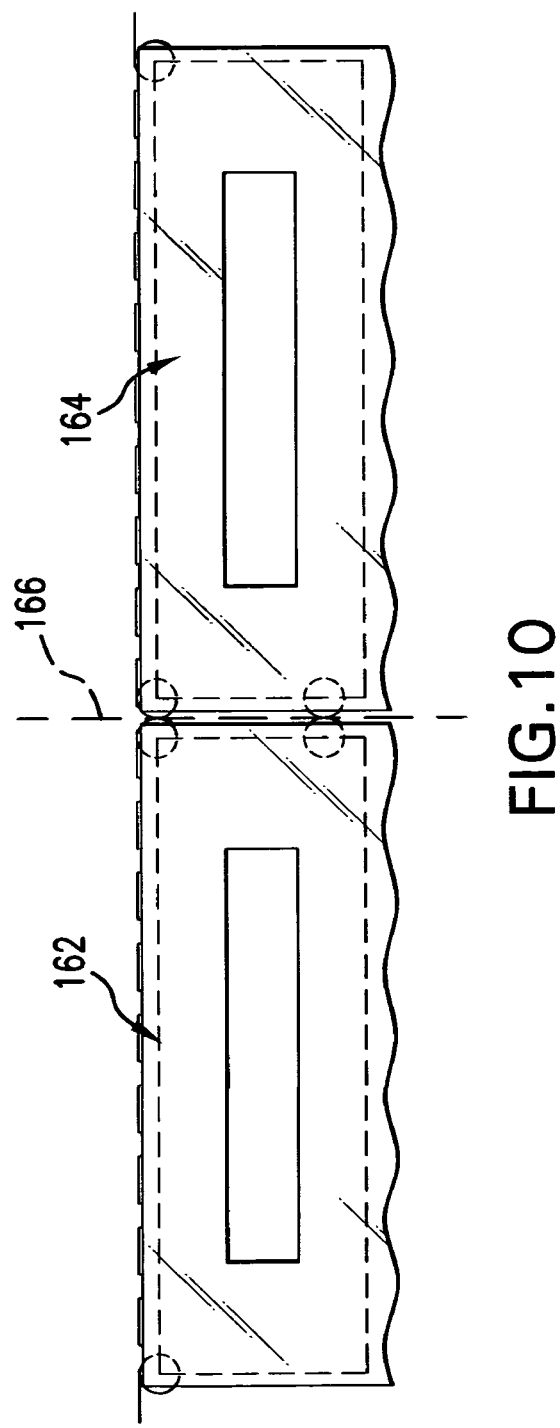
FIG. 10 is a plan view of an embodiment joining multiple packaged devices.

FIG. 4 and the text regarding FIG. 4 disclose how alignment planes 66 and 68 are established with spheres or other connection bodies 24, 62 and 64 that are affixed to a carrier at location that intentionally extend beyond the perimeter of the carrier. FIG. 10 and the text regarding FIG. 10 discloses how two packaged devices 162, 164 can be butted together at alignment plane 166. FIGS. 11-14 depict an improved system using connection bodies arranged in a triad pattern to align abutting adjacent packaged devices so that the packaged devices are aligned with respect one another and with respect to fiducial marks on the silicon of image sensors in the packaged devices.

Figure 11:
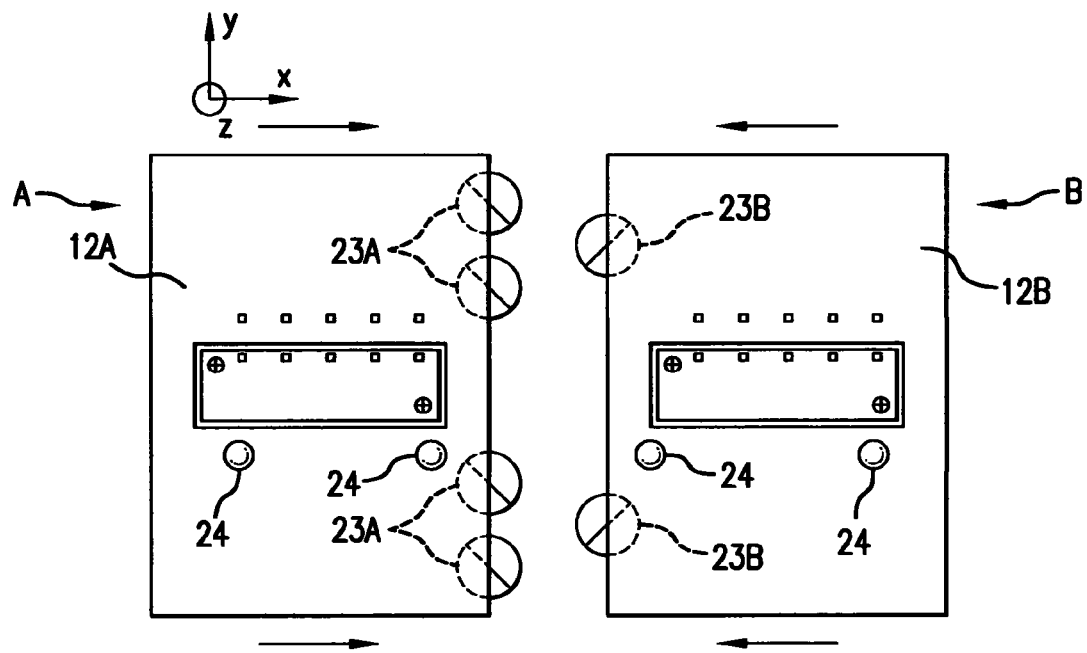
FIGS. 11, 12 and 13 are plan views of another embodiment joining multiple packaged devices.

FIG. 11 depicts two package carriers, A and B, where each package carrier is similar in many ways to package carrier 12 as used in packaged device 10 in FIGS. 1 and 2 and 4 by including image sensor 14 with fiducial marks 18 in carrier 12 and connection bodies that extend beyond the perimeter of the carrier. The carriers 12A and 12B depicted in FIG. 11 may be formed from a printed circuit board (PCB) with interconnects on the PCB, a glass substrate in combination with flex wiring structures, a ceramic substrate in combination with flex wiring structures, a ceramic substrate with interconnects on the ceramic substrate, aluminum with flex wiring structure attached, or aluminum with interconnect layers on the aluminum, or equivalent. In FIG. 11, four connection bodies 23A (e.g., spheres or even round, cylindrical posts) are affixed by adhesive to carrier 12A at locations that extend beyond a first edge of carrier 12A. The four connection bodies may be regarded as organized into two pairs of connection bodies 23A (e.g., spheres): A first pair of connection bodies 23A (e.g., spheres) attached to an upper half and a second pair of connection bodies 23A (e.g., spheres) attached to the lower half of carrier 12A as depicted in FIG. 11. Similarly, two connection bodies 23B (e.g., spheres or even round, cylindrical posts) are affixed by adhesive to carrier 12B at locations that extend beyond an edge of carrier 12B.

A gap (i.e., spatial gap) between individual connection bodies of the first pair of connection bodies (e.g., spheres) 23A attached to upper half of carrier 12A is smaller than a diameter of a corresponding connection body (e.g., spheres) 23B attached to carrier 12B. Similarly, a spatial gap between individual connection bodies of the second pair of connection bodies (e.g., spheres) 23A attached to the lower half of carrier 12A is smaller than a diameter of a corresponding connection body (e.g., spheres) 23B attached to carrier 12B. With this arrangement, two triads are formed when carriers 12A and 12B are urged into one another as depicted by the arrows in FIGS. 11 and 12.

Figure 12:
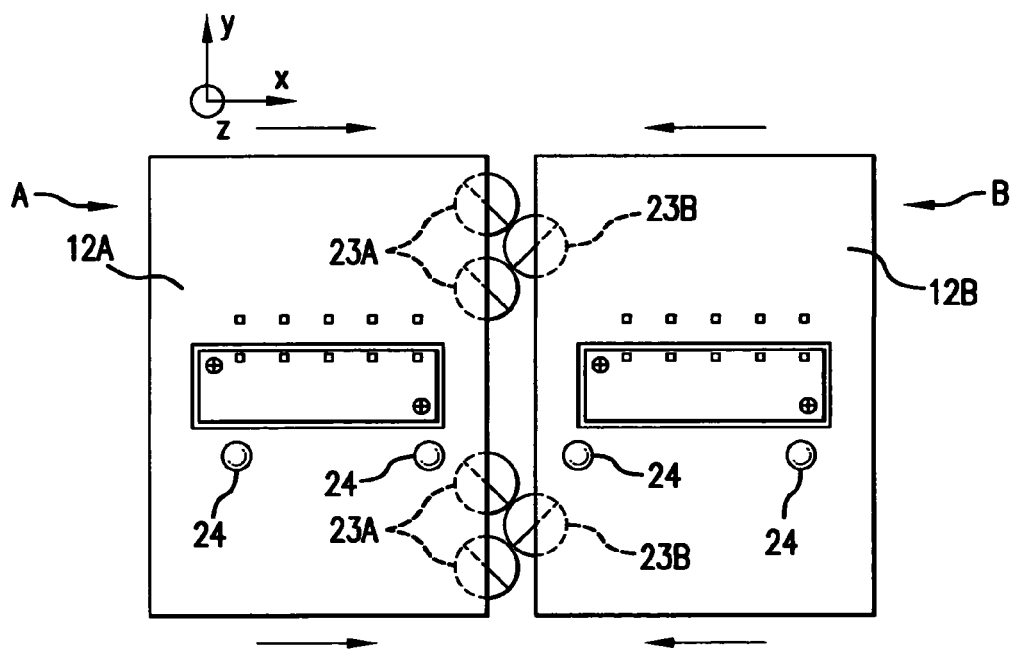

The first pair of connection bodies 23A (e.g., spheres) attached to an upper half of carrier 12A forms a triad with the corresponding connection body (e.g., spheres) 23B attached to carrier 12B as depicted in FIG. 12. Similarly, the second pair of connection bodies 23A (e.g., spheres) attached to the lower half of carrier 12A forms another triad with the corresponding connection body (e.g., spheres) 23B attached to carrier 12B as depicted in FIG. 12.

Figure 14:
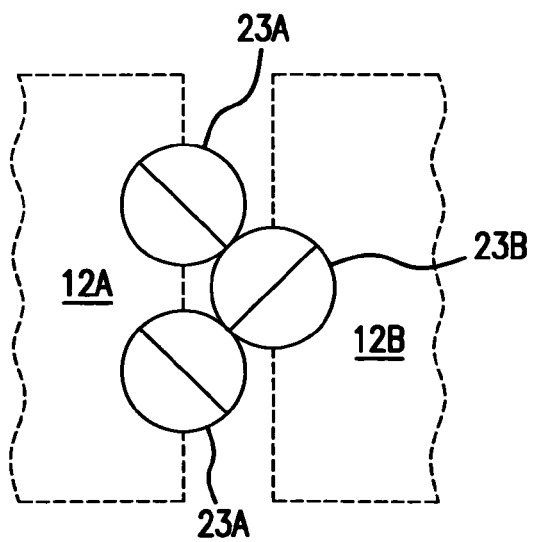
FIG. 14 is a detail view of a triad connector as used in FIGS. 11, 12 and 13.

FIG. 14 depicts a typical triad (i.e., a triangle of connection bodies). Each triad includes the pair of connection bodies (e.g., spheres) 23A attached to carrier 12A and a connection body 23B attached to carrier 12B and wedged into the first pair of connection body. Connection body 23B cannot pass between the pair of connection bodies (e.g., spheres) 23A because the diameter of connection body 23B is larger than the gap between connection bodies 23A of the triad. This arrangement firmly registers the X and Y position of carrier 12A to carrier 12B at a point in the center of connection body 23B.

In FIG. 14, connection body 23B is either a sphere or a short, round, cylindrical post that appears to be circular with a center when viewed in a plan view. Similarly, each of the two connection bodies 23A are either spheres or short, round, cylindrical posts that appear to be circular with a center when viewed in a plan view. In a preferably variant, when connection body 23B is a cylindrical post, then both connection bodies 23A are spheres, and when connection bodies 23A are cylindrical posts, then connection body 23B is a sphere. This variant of the general connection bodies ensures that there is only a single point of contact between connection body 23B and each of connection bodies 23A.

When carriers 12A and 12B in FIG. 14 are urged against one another, package carrier 12A is able to rotate through small angles relative to a frame of reference fixed to package carrier 12B, a center of rotation being located at the center of connection body 23B. During rotation, there is sliding contact at only a single point of contact between connection body 23B and each of connection bodies 23A.

FIG. 12 depicts two triads separated by a distance so that rotational movement of carrier 12A relative to carrier 12B that may exist with a single triad is prevented. A reference line drawn between center points of two connection bodies 23B establishes a fixed line against which angular position within the X, Y plane of carriers 12A and 12B is fixed. The reference line extending between centers of the two connection bodies 23B is fixed by adhesive to package carrier 12B. The same reference line extending between centers of the two connection bodies 23B is fixed relative to package carrier 12A because connection bodies 23A are urged against connection bodies 23B to fix the X and Y location of each triad.

Image sensor 14, as discussed with respect to FIGS. 1 and 2, is held in a vacuum chuck and positioned in uncured adhesive (e.g., epoxy) on the carrier. The vacuum chuck is translated so that the X, Y position of image sensor 14 is precisely registered to the X, Y position of connection bodies 23B affixed to carrier 12B. The vacuum chuck is also rotated so that a line drawn between two fiducial marks 18 on image sensor 14 is angularly registered within the X, Y plane to the angle reference provided by the reference line drawn between center points within the two connection bodies 23B affixed to carrier 12B of FIG. 12. The vacuum chuck is then moved in the Z direction to smash down image sensor 14 into the uncured epoxy until the Z position of imaging sensor 14 is precisely registered to the Z position of connection bodies 23B affixed to carrier 12B. Then, the epoxy is cured in this three-dimensional and single-rotational alignment process so that the X, Y and Z position and angular orientation of image sensor 14 in the X, Y plane becomes fixed relative to the X, Y and Z position of connection bodies 23B and the angular orientation of image sensor 14 relative to the reference line drawn between center points within the two connection bodies 23B.

Interconnection pads for wire bonding are shown on the upper edge (as depicted in FIGS. 11 and 12) of the image sensor, and interconnection pads for wire bonding are also depicted on the carrier just opposite of the interconnection pads of the image sensor. The interconnection pads on the image sensor are the terminals by which electrical power is received at the image sensor and by which electrical signals are delivered to and from the image sensor. The interconnection pads on the carrier are the terminals by which electrical power is delivered from the carrier and electrical signals are delivered to and from carrier.

Next, uncured adhesive material is applied to specific locations on carriers 12A and 12B and alignment bodies 24 (e.g., spheres) are placed in the uncured adhesive material at locations precisely registered relative to connection bodies 23A on carrier 12A and relative to connection bodies 23B on carrier 12B. The adhesive material is then cured.

Figure 13:
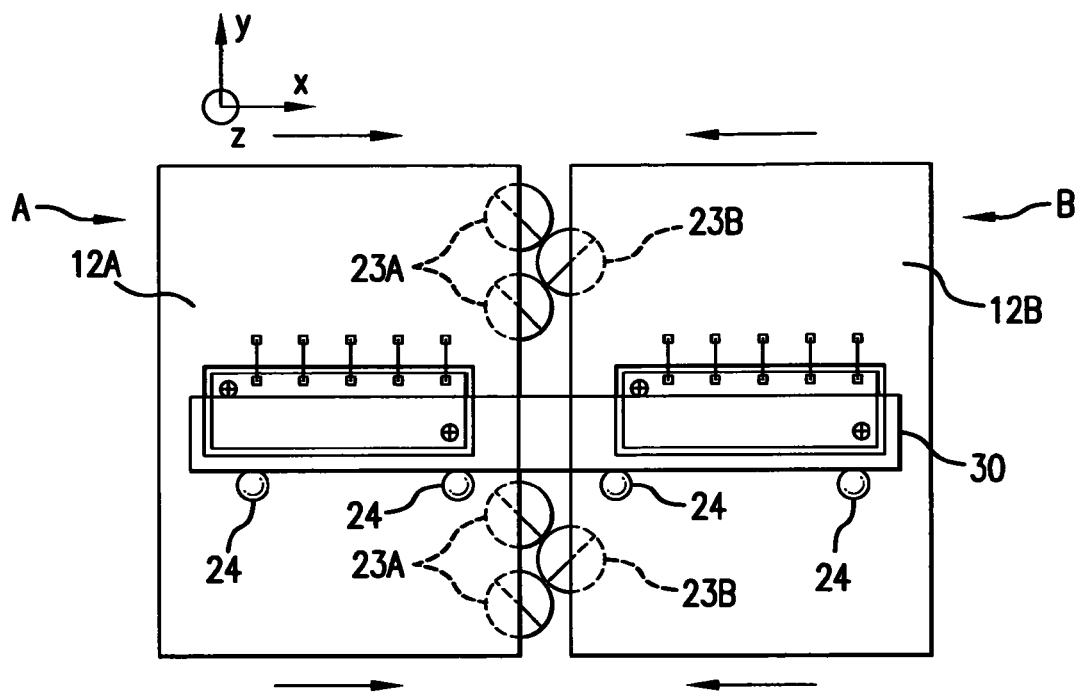

In FIG. 13, fiber optic plate 30 is urged against alignment bodies 24 as alignment pins to provide a Y reference position. While urged against bodies 24, fiber optic plate 30 is also bonded using optically transparent adhesive directly to and in contact with silicon surfaces of the image sensors bonded on package carriers 12A and 12B. The size and shape of fiber optic plate 30 is such that it is disposed between the upper and lower triads and extends longitudinally in the X direction across all image sensors fixed to the package carriers aligned in a row. Fiber optic plate 30 covers all optically active regions of all image sensors fixed to the row of package carriers. However, fiber optic plate 30 does not cover a narrow optically inactive edge of all image sensors fixed to the row of package carriers where interconnection pads are located.

Interconnection pads on the upper edge (as depicted in FIG. 13) of each image sensor are wire bonded to interconnection pads on the package carrier just opposite of the corresponding interconnection pads of the image sensor. Only a few such pads are depicted for each image sensor for clarity, but more or less wire bonds are used as the image sensor demands.

In a further exemplary application, many packaged devices are prepared. A carrier for each device is prepared. For each carrier, four connection bodies 23A (e.g., spheres) extending beyond a first edge of the carrier are affixed with adhesive to the carrier. In addition for each carrier, two connection bodies 23B (e.g., spheres) extending beyond a second and opposite edge of the same carrier are affixed with adhesive to the carrier. The interlocking mechanism for the connection bodies is discussed above with regard to FIGS. 11, 12 and 14. Thereafter, an image sensor is bonded with adhesive (e.g., epoxy) to each carrier after having been accurately positioned relative to connection bodies 23B (e.g., spheres) in X, Y and Z directions and angularly oriented relative to a line between connection bodies 23B (e.g., spheres) as discussed above with regard to FIGS. 11, 12 and 14. The adhesive is then cured.

A plurality of thusly prepared packaged devices are placed on a flat plate jig and lined up edge to edge with four connection bodies 23A (e.g., spheres) at one edge of one packaged device urged into two connection bodies 23B (e.g., spheres) at an opposite edge of an adjacent packaged device to form two connection triads between the two adjacent packaged devices as depicted in FIGS. 12 and 14. Additional packaged devices are connected at edges of this growing line of packaged devices until all of the plurality of packaged devices are lined up, aligned with and urged into adjacent packaged devices. In this way, all image sensors 14, each of which is carried in a respective packaged device of the plurality of packaged devices, are also aligned in X, Y and Z directions and angularly oriented relative to a line between connection bodies 23B (e.g., spheres) as discussed above with regard to FIGS. 11, 12 and 14. Then, an elongated fiber optic plate (depicted as 30 in FIG. 13) is bonded to all image sensors in the row of packaged devices. In this way, a precisely positioned and angularly oriented linear array of image sensors is packaged under a fiber optic plate. In each device thusly prepared, interconnection pads on image sensor and corresponding pads of the carrier are wire bonded to one another.

In a still further exemplary application, many packaged devices are prepared. A carrier for each device is prepared to include both four connection bodies 23A (e.g., spheres) extending beyond a first edge (e.g., the right edge as depicted in FIG. 11) and two connection bodies 23B (e.g., spheres) extending beyond a second and opposite edge (e.g., the left edge as depicted in FIG. 11) as discussed above with regard to FIGS. 11, 12 and 14. In addition, the carrier for each device is prepared to also include both four connection bodies 23A (e.g., spheres) extending beyond a third edge (e.g., the top edge as depicted in FIG. 11) and two connection bodies 23B (e.g., spheres) extending beyond an fourth edge (e.g., the bottom edge as depicted in FIG. 11) opposite from the third edge to serve a vertical interlocking function as is discussed above with regard to FIGS. 11, 12 and 14 serving a horizontal interlocking function.

Thereafter, an image sensor 14 is bonded with adhesive (e.g., epoxy) to each carrier after having been accurately positioned relative to connection bodies 23B (e.g., spheres) in X, Y and Z directions and angularly oriented relative to a line between connection bodies 23B (e.g., spheres) as discussed above with regard to FIGS. 11, 12 and 14. The image sensor adhesive is then cured. Next, an elongated fiber optic plate (depicted as 30 in FIG. 13) is bonded to all image sensors in the row of packaged devices as discussed above. In this way, a precisely positioned and angularly oriented linear array of image sensors is packaged under a fiber optic plate. In each device in the linear array of devices, interconnection pads on image sensor 14 and corresponding pads of the carrier are wire bonded to one another.

Then, a plurality of thusly prepared linear arrays of packaged devices are placed on a flat plate in a jig and lined up edge to edge in a direction transverse to the axis of the linear arrays and urged together on the flat plate to align a two-dimensional array of packaged devices. Then, the linear arrays of packaged devices are bonded to the flat plate or other mechanism to produce an accurately aligned structurally stable two-dimensional array of packaged devices. In this way, a precisely positioned and angularly oriented two-dimensional array of image sensors 14 is packaged under fiber optic plates.

With the above techniques it is possible to produce large format sensors by preparing arrays of image sensors mounted in packaged devices and covered with a fiber optic plate. The image sensor arrays may be linear arrays, two-dimensional arrays or staggered arrays (i.e., two-dimensional arrays but staggered between rows), but all of the image sensors in the array are precisely registered in X, Y and Z directions and precisely oriented angularly. Because the arrays of image sensors are more precisely registered than with earlier techniques, image data from such arrays can be more easily stitched together with stitching software. Such software can be simplified, and such software will have reduced error rates.

As another application example, adhesive material can be placed at select locations on the perimeter of a lens, connection bodies can be placed in the adhesive material and the adhesive material is then cured. Then, the cured lens assembly with connection bodies adhered is flipped upside down and the lens assembly accurately aligned with the faceplate by guiding the lens connection bodies (e.g., spheres) into the holes in the faceplate. In this way, a packaged device housing an image sensor chip with fiducial marks (18, FIG. 2) can be accurately aligned with both the faceplate (130, FIG. 9) and the lens. Such alignment techniques can be extended to a larger stack of objects.

Having described preferred embodiments of a novel method of aligning an image sensor with a faceplate or other body (which are intended to be illustrative and not limiting), it is noted that modifications and variations can be made by persons skilled in the art in light of the above teachings. It is therefore to be understood that changes may be made in the particular embodiments of the invention disclosed which are within the scope of the invention as defined by the appended claims.

Having thus described the invention with the details and particularity required by the patent laws, what is claimed and desired protected by Letters Patent is set forth in the appended claims.

What is claimed is:

1. An assembly comprising:
a first packaged device that contains a carrier having a recessed surface, an intermediate surface and a topmost surface, a first image sensor mounted on the recessed surface, said first image sensor having an optically active portion and first fiducial marks precisely positioned outside of and relative to the optically active portion, and an optically transparent package top on the intermediate surface above the first image sensor, wherein said first fiducial marks are visible through said optically transparent package top;
adhesive on a portion of the topmost surface of the carrier;
a first connection body affixed within the adhesive on the topmost surface of the carrier and registered at a predetermined location relative to the first fiducial marks,
wherein said carrier does not have formed therein positioning apertures recessed with respect to the carrier's topmost surface to receive the adhesive and said first connection body; and
a plate in which has been formed a first counter hole at a predetermined location and an aperture, wherein the first connection body is mated into the first counter hole in the plate, wherein the plate is in direct physical contact with the topmost surface of the carrier with the aperture positioned above and in alignment with the first image sensor.

2. An assembly according to claim 1 further comprising:
additional adhesive on plural additional portions of the topmost surface of the carrier; and
a second connection body and a third connection body fixed within the additional adhesive and registered at respective second and third predetermined locations relative to the first fiducial marks, the first, second and third connection bodies defining a plane,
wherein a second counter hole and a third counter hole have been formed in the plate at respective predetermined locations, the second connection body is mated into the second counter hole and the third connection body has been mated into the third counter hole in the plate.

3. An assembly according to claim 1 further comprising:
a second packaged device that contains a second image sensor having second fiducial marks thereon that are visible through an optically transparent top;
adhesive on a topmost surface of the second packaged device; and
a second connection body fixed within the adhesive and registered at a predetermined location relative to the second fiducial marks, wherein formed within the plate is a second counter hole located at another predetermined location, the second connection body being mated into the second counter hole in the plate, wherein the plate is in direct physical contact with the topmost surface of the second packaged device.

4. An assembly according to claim 1, wherein the adhesive is a UV cured adhesive.

5. An assembly according to claim 1 wherein the topmost surface of the carrier is a topmost surface of the first packaged device.

6. An assembly comprising:
a first packaged device that contains a first image sensor having first fiducial marks thereon;
adhesive on a portion of the first packaged device at a predetermined location relative to the first fiducial marks;
a first connection body affixed within the adhesive and registered at the predetermined location relative to the first fiducial marks, wherein the first connection body is a sphere; and
a plate in which has been formed a first counter hole at a predetermined location, wherein the first connection body is mated into the first counter hole in the plate, wherein the plate is thinner than a diameter of the sphere; and
the first counter hole in the plate includes a first portion comprising a through hole characterized by a diameter substantially equal to the diameter of the sphere and a second portion co-axial with the first portion and comprising a non-through hole partially penetrating the plate from a first surface and characterized by a diameter substantially larger than the diameter of the sphere, wherein the first connection body is mated into the first counter hole in the plate.

7. An assembly comprising:
a first packaged device that contains a first image sensor having first fiducial marks thereon;
adhesive on a portion of the first packaged device at a predetermined location relative to the first fiducial marks;
a first connection body affixed within the adhesive and registered at the predetermined location relative to the first fiducial marks, wherein the first connection body is a sphere; and
a plate in which has been formed a first counter hole at a predetermined location, wherein the first connection body is mated into the first counter hole in the plate, wherein the plate is thicker than a diameter of the sphere; and
the first counter hole in the plate includes a first portion comprising a through hole characterized by a diameter substantially smaller than the diameter of the sphere, a second portion co-axial with the first portion and comprising a non-through hole partially penetrating the plate from a first surface to a depth greater than the diameter of the sphere and characterized by a diameter substantially equal to the diameter of the sphere, and a third portion co-axial with the first portion and comprising another non-through hole partially penetrating the plate from the first surface and characterized by a diameter substantially larger than the diameter of the sphere, wherein the first surface of the plate faces the first packaged device.

8. An assembly according to claim 7 further comprising:
additional adhesive on a second surface of the plate in a substantially concentric ring around the first portion of the first counter hole; and
another sphere fixed within the additional adhesive at a location centered on the first portion of the first counter hole.

9. An assembly comprising:
a first packaged device that contains a first image sensor having first fiducial marks thereon;
adhesive on a portion of the first packaged device at a predetermined location relative to the first fiducial marks;
a first connection body affixed within the adhesive and registered at the predetermined location relative to the first fiducial marks, wherein the first connection body is a sphere; and
a plate in which has been formed a first counter hole at a predetermined location, wherein the first connection body is mated into the first counter hole in the plate, wherein the plate is thicker than two times a diameter of the sphere; and
the first counter hole in the plate includes a first portion comprising a through hole characterized by a diameter substantially equal to the diameter of the sphere, a second portion co-axial with the first portion and comprising a non-through hole partially penetrating the plate from a first surface and characterized by a diameter substantially larger than the diameter of the sphere, and a third portion co-axial with the first portion and comprising another non-through hole partially penetrating the plate from a second surface and characterized by a diameter substantially larger than the diameter of the sphere, wherein the first surface of the plate faces the first packaged device.

10. An assembly according to claim 9 further comprising:
a body having a first surface;
adhesive on a portion of the first surface of the body at a predetermined location referenced to a location of an axis of the first counter hole; and
a second sphere fixed within the adhesive and registered at the predetermined location referenced to the location of the axis of the first counter hole,
wherein the second sphere is disposed within the first portion of the first counter hole and the second surface of the plate faces the first surface of the body.

11. An assembly comprising:
a first packaged device that contains a first image sensor having first fiducial marks thereon and an optically transparent package top, wherein said first fiducial marks are visible through said optically transparent package top;
adhesive on a portion of a topmost surface of the first packaged device;
a first connection body affixed within the adhesive and registered at a predetermined location relative to the first fiducial marks; and
a plate in which has been formed a first counter hole at a predetermined location and an aperture, wherein the first connection body is mated into the first counter hole in the plate, wherein the plate is in direct physical contact with the topmost surface of the first packaged device with the aperture positioned over and in alignment with the first image sensor,
wherein said first packaged device does not have formed therein positioning apertures recessed with respect to the topmost surface of the first packaged device to receive the adhesive and said first connection body.

* * * * *